United States Patent
McDermott et al.

(10) Patent No.: US 8,710,352 B2
(45) Date of Patent: Apr. 29, 2014

(54) CONCENTRATING PHOTOVOLTAIC SYSTEM MODULE WITH ACTUATOR CONTROL

(75) Inventors: Dan McDermott, Fontana, CA (US); Richard L. Johnson, Jr., Suffolk, VA (US)

(73) Assignee: Suncore Photovoltaics, Inc., Irwindale, CA (US)

( * ) Notice: Subject to any disclaimer, the term of this patent is extended or adjusted under 35 U.S.C. 154(b) by 92 days.

(21) Appl. No.: 13/217,812

(22) Filed: Aug. 25, 2011

(65) Prior Publication Data
US 2013/0048051 A1    Feb. 28, 2013

(51) Int. Cl.
*H02N 6/00* (2006.01)
*H01L 31/042* (2006.01)

(52) U.S. Cl.
USPC .......................................... 136/246; 136/251

(58) Field of Classification Search
USPC ................................. 136/246, 251
See application file for complete search history.

(56) References Cited

U.S. PATENT DOCUMENTS

| | | | |
|---|---|---|---|
| 8,017,895 B2 * | 9/2011 | Moser | 250/203.4 |
| 8,297,273 B2 * | 10/2012 | Chyou et al. | 126/569 |
| 2002/0170592 A1 * | 11/2002 | Algora | 136/244 |
| 2006/0035621 A1 * | 2/2006 | Ghercioiu | 455/403 |
| 2007/0227574 A1 * | 10/2007 | Cart | 136/206 |
| 2008/0128586 A1 | 6/2008 | Johnson et al. | |
| 2009/0188488 A1 * | 7/2009 | Kraft et al. | 126/601 |
| 2010/0018570 A1 * | 1/2010 | Cashion et al. | 136/246 |
| 2011/0302405 A1 * | 12/2011 | Marlow | 713/150 |

* cited by examiner

*Primary Examiner* — Jonathan Johnson
*Assistant Examiner* — Angelo Trivisonno
(74) *Attorney, Agent, or Firm* — Mueting, Raasch & Gebhardt, P.A.

(57) ABSTRACT

An arrangement for use in a concentrating photovoltaic system including a module having plurality of solar cells are mounted on a first side, and a plurality of lenses are mounted on a second side. Drive motors are coupled to the module to enable it to track the sun during the course of the day. A sun sensor is attached to the housing to detect a predetermined timed pattern of light blocking to the sensor and for generating a control signal to the drive motors in response to such detection for moving the module to a predetermined fixed position.

18 Claims, 6 Drawing Sheets

CONCENTRATING PHOTOVOLTAIC SYSTEM MODULE WITH ACTUATOR CONTROL

BACKGROUND

Solar array modules used in a concentrating photovoltaic system are constructed to house solar cell receivers that mount a solar cell that converts solar energy into electrical current. The modules include a housing mounted on a support and pivoted for tracking the sun. A plurality of lenses are mounted on one side of the housing that concentrate and focus the incoming sun beams onto respective solar cells. A sun sensor is attached to the housing which provides a control signal to associated actuating drive motors coupled to the module to position the module so that the plane of the lenses is substantially orthogonal to the incoming sun beams as the module tracks the sun during the course of the day.

SUMMARY

The present application is directed to an arrangement for use in a concentrating photovoltaic system including a support; a housing mounted on the support and pivoted for tracking the sun during the course of the day. A plurality of solar cells are mounted on a first side of the housing, and a plurality of lenses are mounted on a second side of the housing opposite the first side for concentrating and focusing the incoming sun beams onto respective solar cells. Drive motors are coupled to the housing for pivotably moving the housing to track the sun during the course of the day. A sun sensor is attached to the housing to provide a control signal to the drive motors so that the motors position the module so that the plane of the lenses is substantially orthogonal to the incoming sun beams as the module tracks the sun during the course of the day; and a controller is coupled to the sun sensor for detecting a predetermined timed pattern of light blocking to the sensor and for generating a control signal to the drive motors in response to such detection for moving the housing to a predetermined fixed position.

DETAILED DESCRIPTION

Figure 1A:
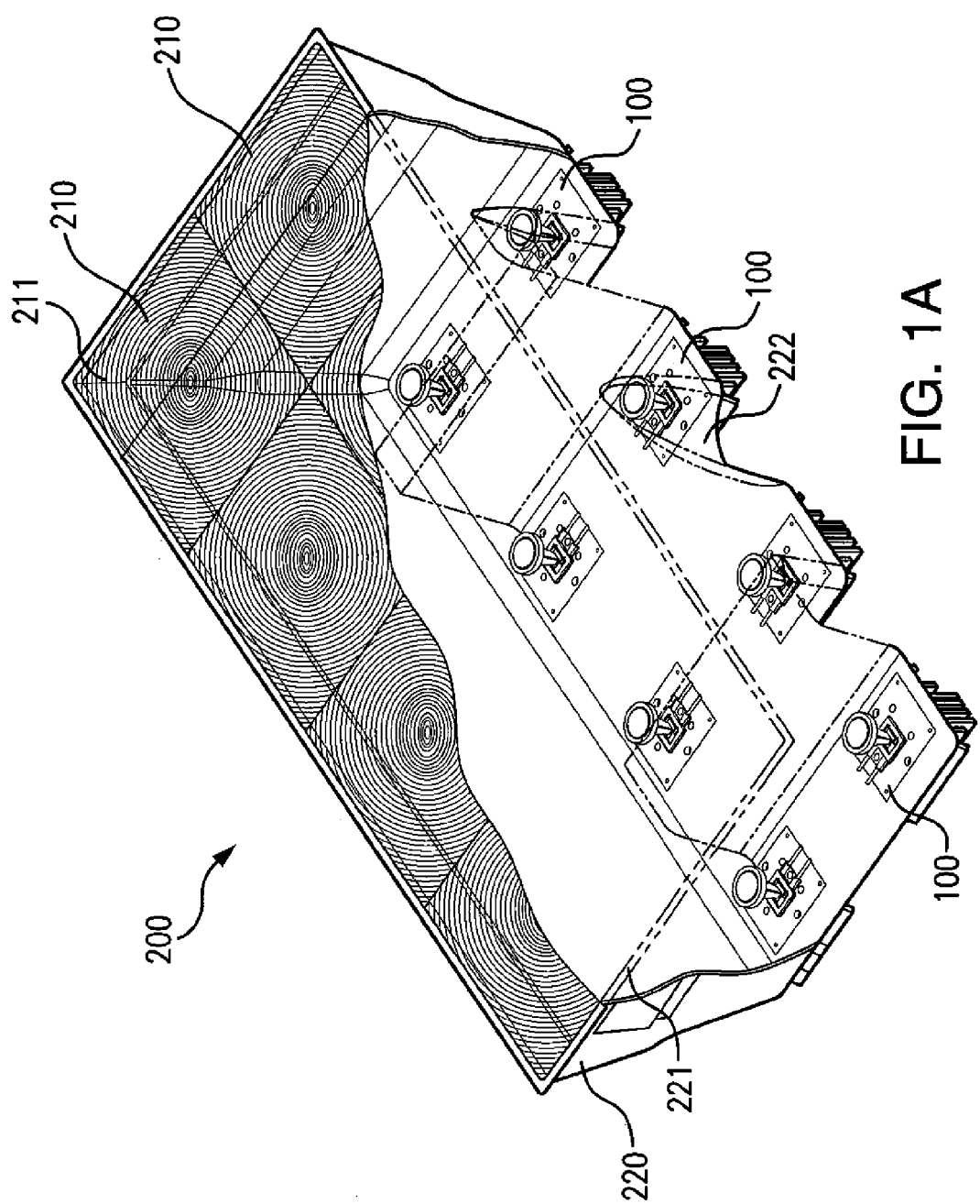
FIG. 1A is a cut-away perspective view of a solar cell module.

FIG. 1A illustrates an implementation of a solar cell module 200 comprising an array of lenses 210 and corresponding solar cell receivers 100. Each one of the lenses 210 is aligned with one of the solar cell receivers 100. The solar cell module 200 may include various numbers of lenses 210 and solar cell receivers 100. FIG. 1A includes a module 200 with eight lenses 210 and solar cell receivers 100 aligned in a 2×4 array.

The lenses 210 are formed on a continuous sheet 211 of optical material (e.g., a silicone coated glass). In some implementations, regions of the sheet 211 not formed into the lenses 210 are made partially or entirely opaque. By forming the lenses 210 out of a continuous sheet 211, costs can be decreased substantially. First, by producing the lenses 210 on large sheets, production costs are decreased. Second, assembly costs are decreased because only one item (i.e., the sheet 211 of lenses) needs to be aligned with the solar cell receivers 100. In this implementation, the sheet 211 lies atop an alignment frame 221 of a housing 220.

In some implementations, the floor surface 222 of the housing 220 comprises alignment features that ensure that each of the solar cell receivers 100 is located in a predetermined position. These features may couple with each of the solar cell receivers 100.

In some implementations, each of the lenses 210 is a Fresnel lens. The corresponding solar cell receiver 100 is positioned on the surface 222 at an opposite end of the housing 220.

Figure 1B:
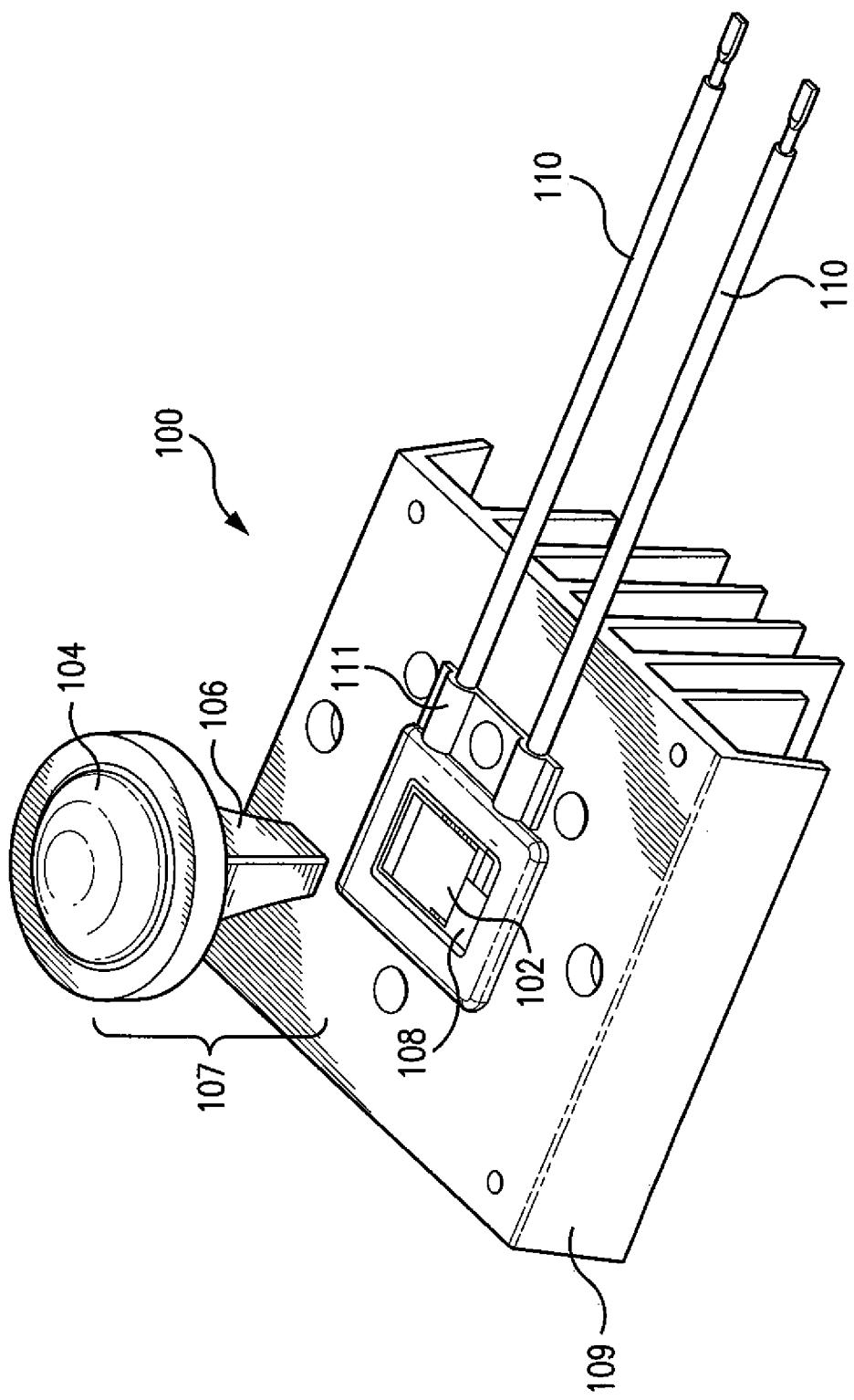
FIG. 1B is a perspective view of a receiver as used in the solar cell module of FIG. 1A.

FIG. 1B is a perspective view of a receiver 100 as used in the solar cell module of FIG. 1A. Each of the solar cell receivers 100 includes a corresponding solar cell 102 disposed in the optical path of the corresponding lens 210, i.e., such that the corresponding solar cell 102 receives light that passes through the corresponding lens 210. In some implementations, additional optical elements are employed to place the solar cell in the optical path of the lens. For example, secondary optical elements 104 correspond with each pair of the solar cell receivers 100 and the lenses 210. The secondary optical elements 104 gather the light from the lens 210 and direct it into the solar cell 102 of the solar cell receiver 100. In some implementations, each of the solar cell receivers 100 is provided with a corresponding secondary optical element 104. The SOE 104 is disposed inside the housing 220 of the solar cell module 200 and is generally designed to collect solar energy concentrated by one of the corresponding lenses 210.

Another optical element that may be provided in some embodiments includes a concentrator 106 that is positioned between each of the pairs of solar cell receivers 100 and lenses 210. The concentrator 106 concentrates the light onto the solar cell 102. In some embodiments, the secondary optical element 104 and the concentrator 106 may form a single integral optical element 107.

Some implementations of the lenses 210 concentrate incident sunlight to 500 times normal concentration (i.e., 500 Suns) or more. With the use of a 2× concentrator 106, the resulting concentration of sunlight may be 1000 times normal concentration (i.e., 1000 Suns) or more, depending upon the cumulative concentration of the Fresnel lens and the concentrator. Other implementations may include other concentrations. Generally speaking, conversion efficiency of solar energy into electricity increases under concentrated illumination. For example, at about 1000 Suns, a single solar cell receiver with a 5.5 mm square solar cell can generate from seven to eight watts or more of peak DC electrical power. The amount of electrical power a solar cell receiver can produce can vary depending on, for example, the combination of solar cell characteristics (e.g., size, composition), properties of the associated optics (e.g., concentration, focus, alignment), the time of day and time of the year, and the geographic location of the installation.

In some implementations, the solar cells 102 of each of the respective solar cell receivers 100 is a triple-junction solar cell, composed of compound semiconductors, with each of the three subcells arranged in tandem or electrical series. In some embodiments, the solar cells are substantially square in shape and having a side length of less than 6 mm, and are mounted on a ceramic substrate 108 having a first metalized surface and an opposing second metalized surface. The solar cell has a conductive first bottom surface connected to a first one of the conductive regions of the ceramic substrate and an opposing second light-receiving surface having a conductive contact area connected (by wire bonds or the like, not shown) to a second one of the conductive regions. The ceramic substrate 108 is mounted on a heat sink 109 which conducts and dissipaters the heat generated from intense light impinging on the solar cell.

In applications where multiple solar cell modules 200 are employed, the receivers 100 of the solar cell modules 200 are typically electrically connected together in series by wires 110. FIG. 1B depicts two wires 110 which make contact with the anode and cathode terminals of the solar cell. In some embodiments, the wires 110 are secured in place by a clamp 111 mounted on the heat sink 109. However, other applications may utilize parallel or series-parallel electrical connections. For example, receivers 100 within a given module 200 can be electrically connected together in series, but the modules 200 are connected to each other in parallel.

Figure 2:
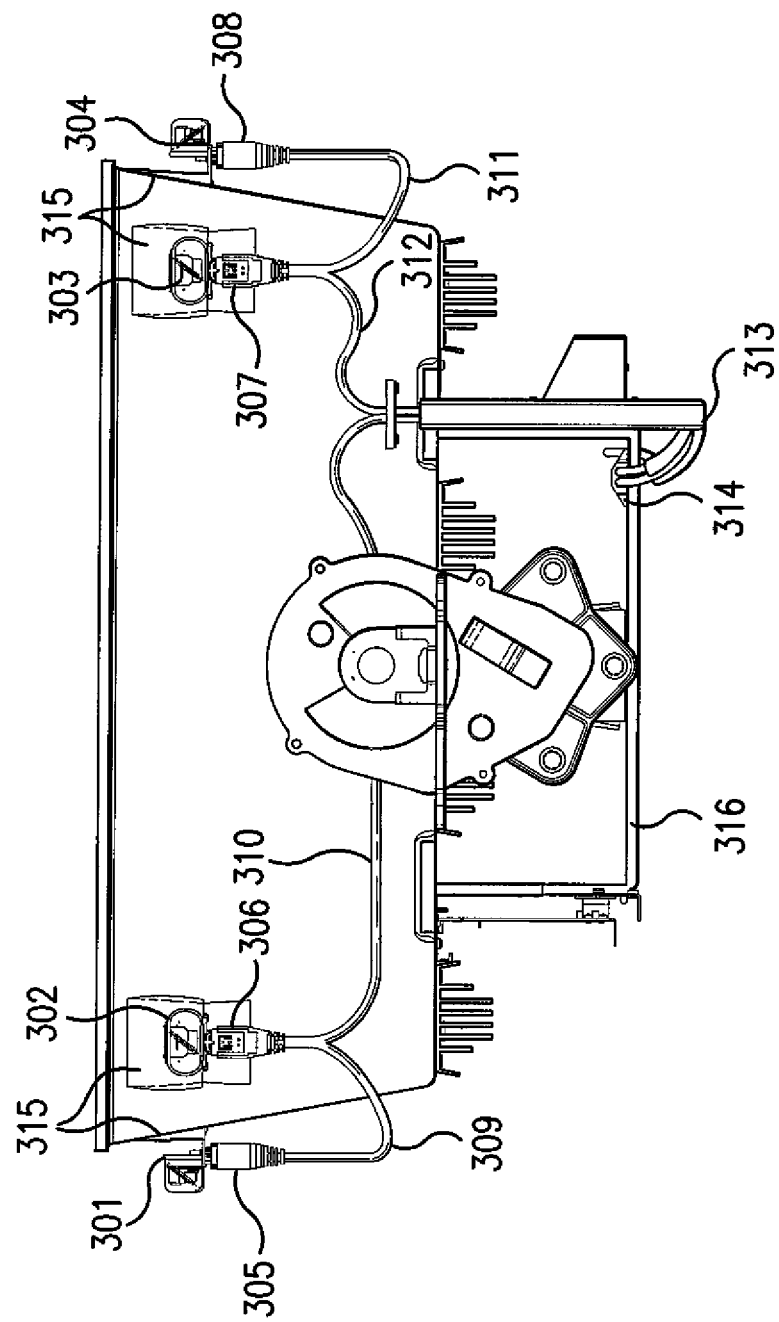
FIG. 2 is a side elevational view of a solar cell module depicting the sun sensors.

FIG. 2 is a side elevational view of a solar cell module 200 depicting the sun sensors 301, 302, 303 and 304 mounted on the housing and positioned facing the sun (not shown). The sun sensors 301, 302, 303 and 304 function to provide a first control signal to the drive motors so that the motors position the module 200 so that the plane of the lenses 210 is substantially orthogonal to the incoming sun beams as the module tracks the sun during the course of the day. A more detailed description of the structure and function of one embodiment of a sun sensor is set forth in published U.S. Patent Application No. 2008/0128586 (Johnson Jr., et al.), the entirety of which is incorporated herein by reference.

According to the present disclosure, one or more sensors 301, 302, 303, and 304 can also function to provide a control signal to the drive motors so that the motors position the module 200 in a "maintenance" position so that maintenance can be performed on the module 200 or an array of modules 200. Exemplary embodiments of positioning a module into maintenance position are described below in connection with FIGS. 4, 5(a), and 5(b).

Sun sensors 301, 302, 303, and 304 can be mounted to module 200 via mounting features 315 which are secured to the outer side faces of the module 200. A more detailed description of the structure and function of one embodiment of a mounting feature 315 is set forth in published U.S. Patent Application No. 2010/0018570 (Cashion, et al.), the entirety of which is incorporated herein by reference.

The sun sensors 301, 302, 303, and 304 have receptacles or sockets (not shown) which mate with detachable electrical connectors 305, 306, 307 and 308 respectively. In some embodiments the electrical connectors are six-pin connectors. The electrical connectors 305, 306, 307 and 308 are coupled to multi-conductor electrical cables 309, 310, 311, and 312 respectively, which are then aligned and fed into conduit 313 that extends below the bottom side surface of the module 200 and attaches to an output electrical connector 314. The electrical connector 314 may be mounted on a frame rail member 316.

Figure 3:
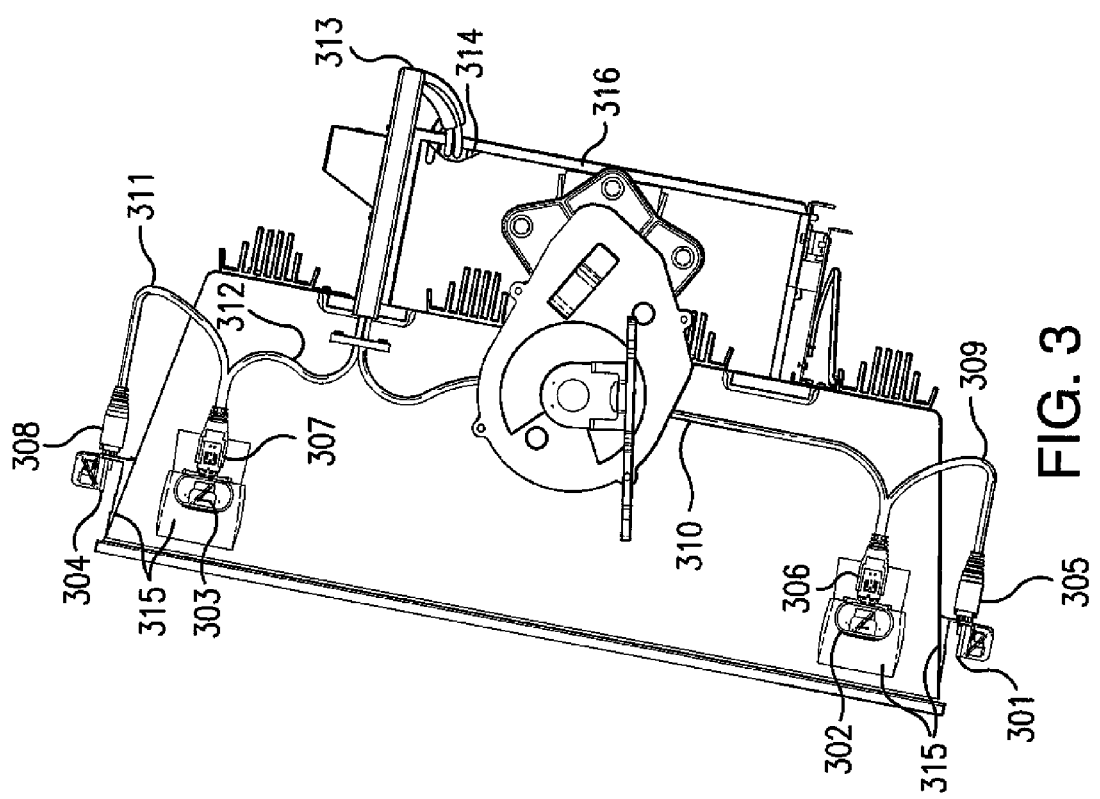
FIG. 3 is a side elevational view of a solar cell module in the starting or "home" position.

FIG. 3 is a side elevational view of a solar cell module in the starting or "home" position. This is the position in which the module is rotated to the left to the fullest extent possible, and in which the module will start to track the sun at a time after sunrise.

Figure 4:
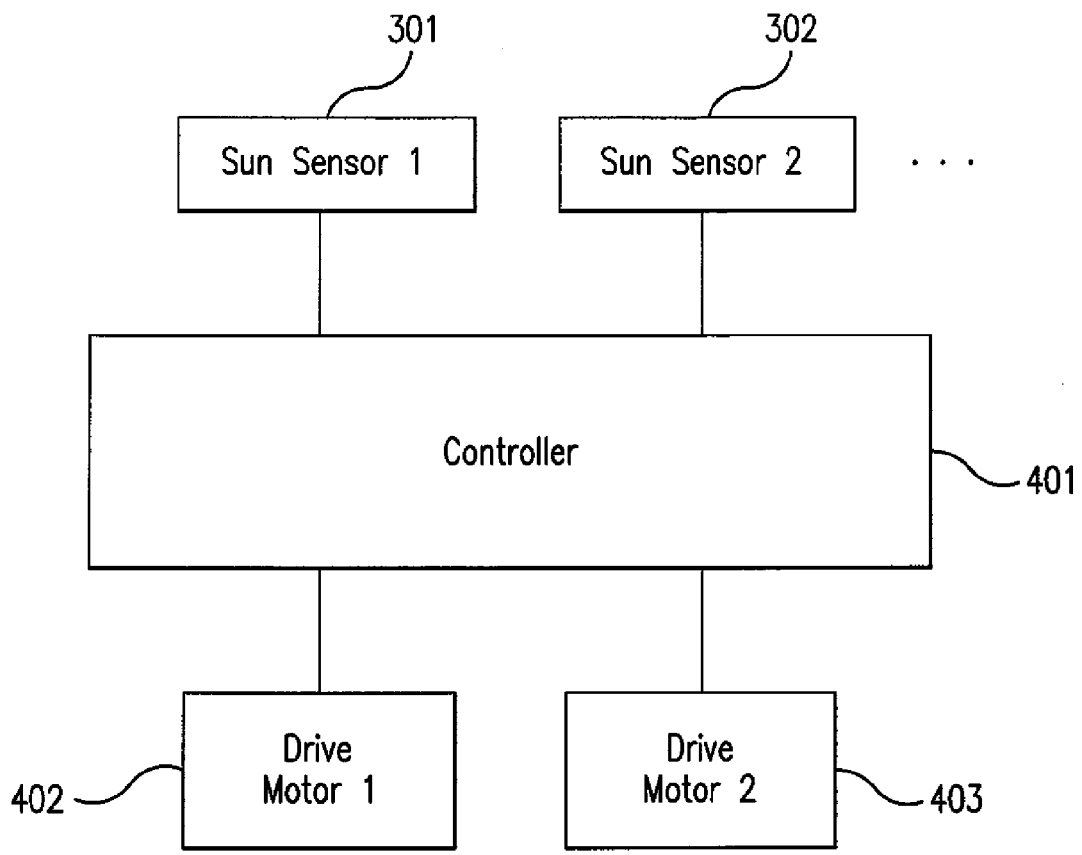
FIG. 4 is a highly simplified block diagram of the sun sensor control system.

FIG. 4 is a highly simplified block diagram of the sun sensor control system. The sun sensors 301 and 302 are electrically connected to a controller 401. As shown in FIGS. 2 and 3, in one embodiment, the controller may be electrically coupled to the sun sensors in a module 200 by the connector 314. The controller 401 has outputs which are connected to the two drive motors 402 and 403 respectively. The drive motors are mechanically coupled to the module 200 for pivotably moving the module to track the sun during the course of the day. Reference may be made to U.S. Patent Application No. 2010/0018570 (Cashion, et al.) for further details of the actuation and tracking mechanism.

The operation of the sun sensor control system according to the present disclosure is to make additional use of the sun sensors which are normally used for alignment purposes, i.e. ensuring that the modules are aligned and pointed to the sun so that the incoming light beams are orthogonal to the surface of the lenses 210. One additional use in one embodiment of the present disclosure is to send a control signal to the actuator motors to re-position the modules in a predetermined position where they may be accessed most easily during a maintenance operation, such as for example the positions depicted in FIG. 2 or 3 above.

In one embodiment of the present disclosure, light is totally blocked from one or more of the sun sensors for a predetermined period of time. Under such circumstances, the output signal emitted by the sun sensor will go from a high value to zero. Since even under cloudy, rainy or overcast weather, the sun sensor is receiving some light, and will output a relatively low signal, so that the appearance of a zero signal during normal daylight operation is an exceptional occurrence, and can be used as a control signal when provided to a suitable processor monitoring the output levels of the sun sensors.

By suitably specifying the specific predetermined period of time (e.g. between one and ten seconds, between ten and thirty seconds, more than thirty seconds, etc.) to trigger a control signal, or in other embodiments by repeating the operation at least twice (e.g., block for five seconds, pause, and block for five seconds a second time), the encoding process may be made sufficiently complex that it would not occur naturally due to the environmental ambient light conditions. Moreover, different predetermined timed patterns of light blocking may be used to represent different operations: for example, a first pattern may represent actuation to the position of the module to that of FIG. 2, while a second pattern may represent actuation to the position of the module to that of FIG. 3.

In other embodiments of the present disclosure, a predetermined timed patterns of light blocking may be used to sample the operational status of the system (e.g., the amount of power being produced), and to communicate that data over a communication link to an remotely located external monitoring station, or to reconfigure the operational architecture of the array (e.g. shut down operation of one module, one panel row, etc).

In other embodiments of the present disclosure, the light may be totally blocked from two of the sun sensors simultaneously for a predetermined period of time to trigger a control signal, as will be illustrated in the control pattern of FIG. 5(b) noted below.

Figure 5A:
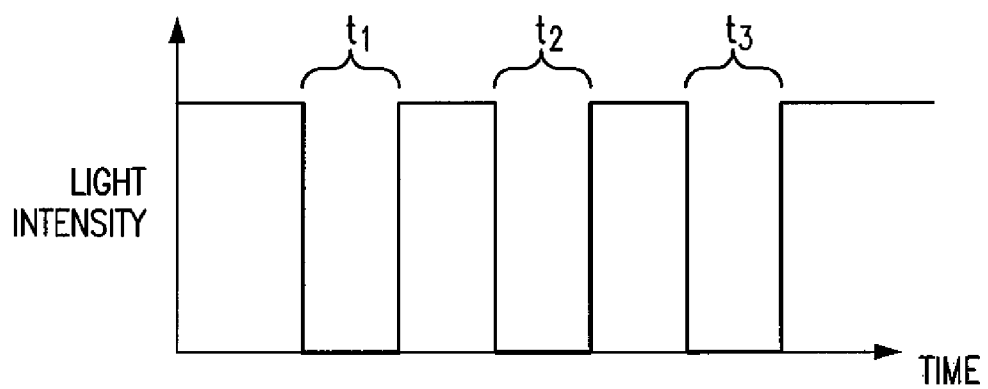
FIG. 5(a) is one embodiment of a light blocking pattern with one sun sensor that represents a control signal.

FIG. 5(a) is one embodiment of a light blocking pattern with one sun sensor that represents a control signal. In this example, the sensor is blocked for three successive time periods $t_1$, $t_2$, $t_3$, which are approximately of equal duration.

Figure 5B:
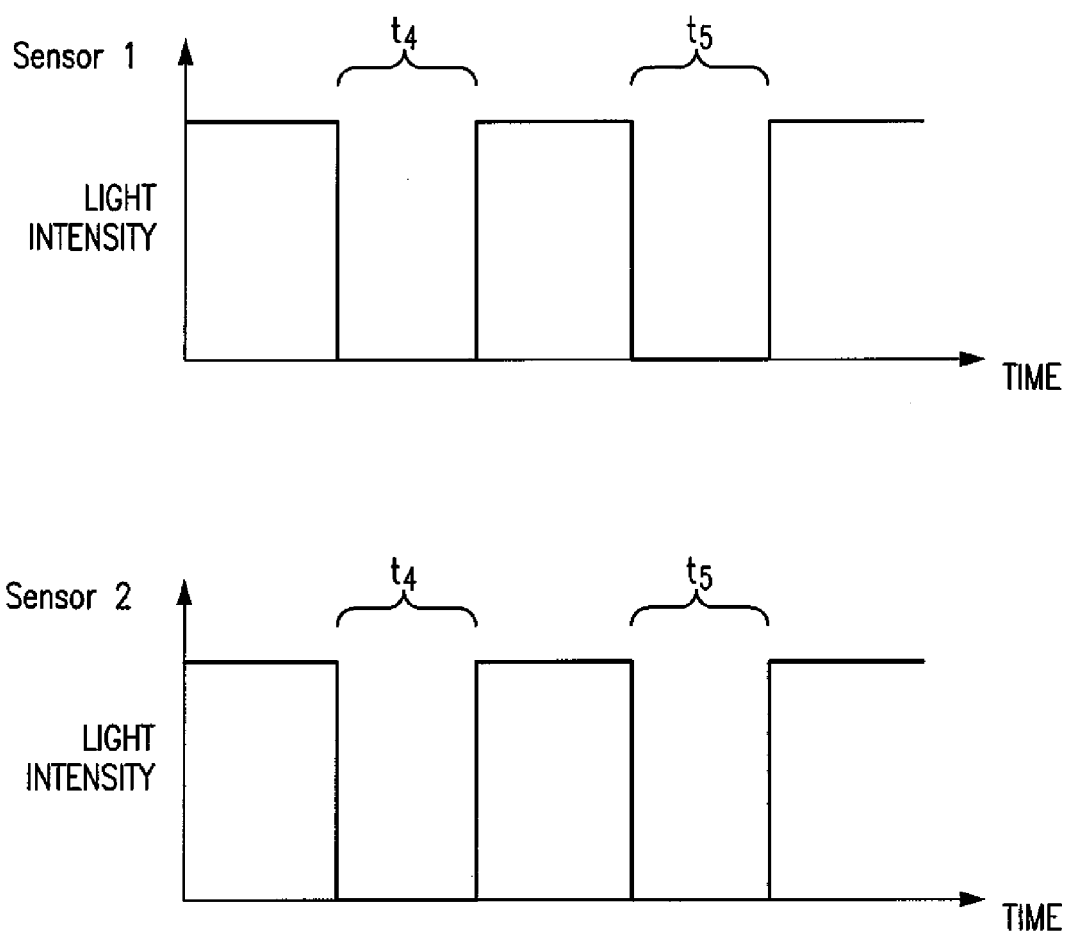
FIG. 5(b) is one embodiment of a light blocking pattern with two sun sensors that represents a control signal.

FIG. 5(b) is one embodiment of a light blocking pattern with two sun sensors that represents a control signal. In this example, the two sensors are simultaneously blocked for two successive time periods $t_4$, $t_5$, which are approximately of equal duration.

While the present disclosure illustrates and describes a control system for use in a photovoltaic power system, it is not intended to be limited to the details shown, since various modifications and structural changes may be made without departing in any way from the spirit of the present disclosure.

It will be understood that each of the elements described above, or two or more together, also may find a useful application in other types of constructions differing from the types described above. In particular, certain configurations presented according to particular aspects of the present invention have been shown and described as discrete elements, i.e., sun sensors, connectors, cables, processors, actuators, etc. Those skilled in the art will readily appreciate that many or all of these individual, discrete components may be fabricated and/or packaged into integrated elements, e.g. an integrated connector and cable.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The foregoing described embodiments depict different components contained within, or connected with, different other components. It is to be understood that such depicted arrangements or architectures are merely exemplary, and that in fact many other arrangements or architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of specific structures, architectures or intermedial components. Likewise, any two components so associated can also be viewed as being "operably connected" or "operably coupled" to each other to achieve the desired functionality.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," "comprise" and variations thereof, such as, "comprises" and "comprising" are to be construed in an open, inclusive sense, that is as "including, but not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting.

Without further analysis, from the foregoing others can, by applying current knowledge, readily adapt the disclosed technology for various applications. Such adaptations should and are intended to be comprehended within the meaning and range of equivalence of the following claims.

We claim:

1. A solar array arrangement for use in a concentrating photovoltaic system comprising:
   a support;
   a housing mounted on the support and pivoted for tracking the sun during the course of the day;
   a plurality of solar cells mounted on a first side of the housing;
   a plurality of lenses mounted on a second side of the housing opposite the first side for concentrating and focusing the incident sunlight onto respective solar cells;
   drive motors coupled to the housing for pivotably moving the housing to track the sun during the course of the day;
   a first sun sensor attached to the housing; and
   a controller coupled to the first sun sensor and to the drive motors, wherein the controller is programmed to:
      receive an output signal from the first sun sensor,
      generate, based on at least the output signal from the first sun sensor, a first control signal and provide the first control signal to the drive motors to position the housing so that the plane of the lenses is substantially orthogonal to the incident sunlight as the housing tracks the sun during the course of the day,
      detect, within the output signal, an operator blocking the first sun sensor for a predetermined timed pattern of light blocking that is sufficiently complex such that it would not occur naturally due to environmental ambient light conditions, and
      generate, in response to detection of the predetermined timed pattern of light blocking, a second control signal and provide the second control signal to the drive motors to move the housing to a predetermined fixed position.

2. An arrangement as defined in claim 1, wherein the predetermined timed pattern of light blocking is comprised of at least two intervals lasting greater than two seconds and less than ten seconds.

3. An arrangement as defined in claim 1, further comprising a second sun sensor attached to the housing, and wherein the controller is coupled to the second sun sensor and further configured to:
   receive an output signal from the second sun sensor, generate, based at least on the output signal from the second sun sensor, the first control signal,
detect, within the output signal, an operator blocking the second sun sensor for a predetermined timed pattern of light blocking that is sufficiently complex such that it would not occur naturally due to environmental ambient light conditions, and
generate, in response to detection of the predetermined timed pattern of light blocking to both the first sun sensor and the second sun sensor, the second control signal and provide the second control signal to the drive motors to move the housing to the predetermined fixed position.

4. An arrangement as defined in claim 3, wherein the predetermined timed pattern of light blocking to both the first sun sensor and the second sun sensor is comprised of at least two simultaneous intervals lasting greater than two seconds and less than ten seconds.

5. An arrangement as defined in claim 1, wherein the predetermined fixed position is the housing being positioned at one of the ends of the pivoting motion of the housing.

6. An arrangement as defined in claim 1, wherein the predetermined fixed position is the housing being positioned substantially parallel to the support surface.

7. An arrangement as defined in claim 1, wherein the solar cells are III-V compound semiconductor solar cells being substantially square in shape and having a side length of less than 6 mm, wherein the solar cells are mounted on a ceramic substrate, wherein the solar cell comprises a conductive first bottom surface connected to a first conductive region of the ceramic substrate and an opposing second light-receiving surface having a conductive contact area connected to a second conductive region of the ceramic substrate.

8. An arrangement as defined in claim 1, wherein the lenses are Fresnel lenses.

9. An arrangement as defined in claim 1, wherein the housing is a thermoplastic molded structure.

10. An arrangement as defined in claim 1, wherein the sun sensor is electrically coupled to the controller using a detachable six-pin connector and cable.

11. A solar array arrangement for use in a concentrating photovoltaic system comprising:
a support;
a housing mounted on the support and pivoted for tracking the sun during the course of the day;
a plurality of solar cells mounted on a first side of the housing;
a plurality of lenses mounted on a second side of the housing opposite the first side for concentrating and focusing the incident sunlight onto respective solar cells;
drive motors coupled to the housing for pivotably moving the housing to track the sun during the course of the day;
a sun sensor attached to the housing; and
a controller coupled to the sun sensor and to the drive motors, wherein the controller is programmed to:
receive an output signal from the sun sensor,
generate, based on at least the output signal, a first control signal and provide the first control signal to the drive motors to position the housing so that the plane of the lenses is substantially orthogonal to the incident sunlight as the housing tracks the sun during the course of the day,
detect, within the output signal, an operator blocking the sun sensor for a predetermined timed pattern of light blocking that is sufficiently complex such that it would not occur naturally due to environmental ambient light conditions, and
generate, in response to detection of the predetermined timed pattern of light blocking, a second control signal to communicate a status signal to a remote monitoring station.

12. A solar array arrangement for use in a photovoltaic system comprising:
a support;
one or more solar cell modules pivotally mounted to the support and configured to track the sun;
at least one drive motor coupled to the one or more solar cell modules for pivoting the one or more solar cell modules to track the sun;
at least one sun sensor coupled to the one or more solar cell modules, wherein the at least one sun sensor is configured to generate an output signal representative of an amount of light received by the at least one sun sensor; and
a controller coupled to the at least one sun sensor and the at least one drive motor, wherein the controller is programmed to:
receive an output signal from the at least one sun sensor,
generate, based on the output signal from the at least one sun sensor, a first control signal and provide the first control signal to the at least one drive motor to position the housing to track the sun during the course of the day,
detect, within the output signal, an operator blocking the at least one sun sensor for a first predetermined timed pattern of light blocking that is sufficiently complex such that it would not occur naturally due to environmental ambient light conditions, and
trigger a first operation in response to detection of the first predetermined timed pattern of light blocking.

13. The arrangement of claim 12, wherein the first operation comprises one of moving the one or more solar cell modules to a predetermined fixed position, providing an operational status of the arrangement, communicating data over a communication link to a remotely located external monitoring station, and reconfiguring an operational architecture of the arrangement.

14. The arrangement of claim 12, wherein the controller is further configured to:
detect, within the output signal, an operator blocking the at least one sun sensor for a second predetermined timed pattern of light blocking that is sufficiently complex such that it would not occur naturally due to environmental ambient light conditions that is different than the first predetermined timed pattern of light blocking, and
trigger a second operation in response to detection of the second predetermined timed pattern, wherein the second operation is different than the first operation.

15. A solar array arrangement for use in a photovoltaic system comprising:
a support;
one or more solar cell modules pivotally mounted to the support and configured to track the sun;
at least one drive motor coupled to the one or more solar cell modules for pivoting the one or more solar cell modules to track the sun;
at least one sun sensor coupled to the one or more solar cell modules, wherein the at least one sun sensor is configured to generate an output signal representative of an amount of light received by the at least one sun sensor; and
a controller coupled to the at least one sun sensor to receive an output signal from the at least one sun sensor and coupled to the at least one drive motor, wherein the controller is programmed to:
generate, based on at least the output signal from the at least one sun sensor, a first control signal and provide the first control signal to the at least one drive motor to position the housing to track the sun during the course of the day,
detect a first predetermined timed pattern of total light blocking to the at least one sun sensor during daylight operation, and
trigger at least one operation in response to detection of the first predetermined timed pattern of light total blocking.

16. The arrangement of claim 15, wherein the at least one operation comprises one of moving the one or more solar cell modules to a predetermined fixed position, providing an operational status of the arrangement, communicating data over a communication link to a remotely located external monitoring station, and reconfiguring an operational architecture of the arrangement.

17. The arrangement of claim 15, wherein the controller is further configured to:
detect a second predetermined timed pattern of total light blocking to the at least one sun sensor during daylight operation that is different than the first predetermined timed pattern of total light blocking, and
trigger at least one operation in response to detection of the second predetermined timed pattern of total light blocking that is different from the at least one operation triggered in response to detection of the first predetermined timed pattern of light total blocking.

18. The arrangement of claim 15, wherein the at least one sun sensor comprises two sun sensors, wherein, to detect the first predetermined timed pattern of total light blocking to the at least one sun sensor during daylight operation, the controller is configured to detect the first predetermined timed pattern of total light blocking to each of the two sun sensors during daylight operation.

* * * * *